United States Patent
Dakshina-Murthy et al.

(10) Patent No.: US 6,787,476 B1
(45) Date of Patent: Sep. 7, 2004

(54) ETCH STOP LAYER FOR ETCHING FINFET GATE OVER A LARGE TOPOGRAPHY

(75) Inventors: Srikanteswara Dakshina-Murthy, Austin, TX (US); Cyrus E. Tabery, Sunnyvale, CA (US); Chih-Yuh Yang, San Jose, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/632,989

(22) Filed: Aug. 4, 2003

(51) Int. Cl.[7] .................. H01L 21/302; H01L 21/461
(52) U.S. Cl. ................. 438/740; 438/197; 438/584
(58) Field of Search .................... 438/740, 197, 438/199, 206, 584, 595, 689

(56) References Cited

U.S. PATENT DOCUMENTS

| | | | | |
|---|---|---|---|---|
| 6,635,909 B2 | * | 10/2003 | Clark et al. ................. | 257/192 |
| 6,642,090 B1 | * | 11/2003 | Fried et al. ................. | 438/164 |
| 6,657,252 B2 | * | 12/2003 | Fried et al. ................. | 257/316 |
| 6,657,259 B2 | * | 12/2003 | Fried et al. ................. | 257/350 |
| 6,664,582 B2 | * | 12/2003 | Fried et al. ................. | 257/308 |

OTHER PUBLICATIONS

Digh Hisamoto et al., "FinFET–A Self–Aligned Double–Gate MOSFET Scalable to 20 nm," IEEE Transactions on Electron Devices, vol. 47, No. 12, Dec. 2000, pp. 2320–2325.
Yang–Kyu Choi et al., "Sub–20nm CMOS FinFET Technologies," 2001 IEEE, IEDM, pp. 421–424.
Xuejue Huang et al., "Sub–50 nm P–Channel FinFET," IEEE Transactions on Electron Devices, vol. 48, No. 5, May 2001, pp. 880–886.
Xuejue Huang et al., "Sub 50–nm FinFET: PMOS," 1999 IEEE, IEDM, pp. 67–70.
Yang–Kyu Choi et al., "Nanoscale CMOS Spacer FinFET for the Terabit Era," IEEE Electron Device Letters, vol. 23, No. 1, Jan. 2002, pp. 25–27.

* cited by examiner

*Primary Examiner*—David Nhu
(74) *Attorney, Agent, or Firm*—Harrity & Snyder, LLP

(57) ABSTRACT

A method of forming a gate for a Fin Field Effect Transistor (FinFET) is provided. The method includes forming a first layer of material over a fin and forming a second layer over the first layer. The second layer includes either Ti or TiN. The method further includes forming a third layer over the second layer. The third layer includes an anti-reflective coating. The method also includes etching the first, second and third layers to form the gate for the FinFET.

20 Claims, 13 Drawing Sheets

TOP VIEW

FIN CHANNEL + S/D
905

CROSS SECTIONAL VIEW

FIN CHANNEL + S/D
905

BURIED OXIDE
910

US 6,787,476 B1

ETCH STOP LAYER FOR ETCHING FINFET GATE OVER A LARGE TOPOGRAPHY

TECHNICAL FIELD

The present invention relates generally to transistors and, more particularly, to fin field effect transistors (FinFETs).

BACKGROUND ART

Scaling of device dimensions has been a primary factor driving improvements in integrated circuit performance and reduction in integrated circuit cost. Due to limitations associated with existing gate-oxide thicknesses and source/drain (S/D) junction depths, scaling of existing bulk MOSFET devices below the 0.1 $\mu$m process generation may be difficult, if not impossible. New device structures and new materials, thus, are likely to be needed to improve FET performance.

Double-gate MOSFETs represent new devices that are candidates for succeeding existing planar MOSFETs. In double-gate MOSFETs, the use of two gates to control the channel significantly suppresses short-channel effects. A FinFET is one example of a recent double-gate structure that includes a channel formed in a vertical fin. The FinFET is similar to existing planar MOSFETs in layout and fabrication. The FinFET also provides a range of channel lengths, CMOS compatibility and large packing density compared to other double-gate structures.

DISCLOSURE OF THE INVENTION

Consistent with the present invention, methods for forming a FinFET gate are provided that alleviate problems that occur, using conventional gate formation processes, because of anti-reflective coating (ARC) over-etch due to high topography. During conventional ARC etching to form a FinFET gate, using, for example, $CF_4$ or $CHF_3$ etching processes, the underlying polysilicon gate material can be attacked, thus, increasing the chance of source/drain attack (e.g., rough or dirty fin sidewalls), pitting and poor profile. To alleviate this problem, an etch stop layer may be formed, consistent with the invention, between the ARC and the gate polysilicon. The etch stop layer prevents over-etching of the ARC, that may occur due to the severe topography of the Fin device, from attacking the source/drain regions or gate material of the FinFET. The etch stop layer may include Ti or TiN that has a very low etch rate in a fluorine etching process, such as, for example, a $CF_4/Ar$ etching process. Subsequent to etching of the ARC, the etch stop layer and polysilicon material of the gate may be etched using, for example, a $Cl_2/HBr$ etching process.

Additional advantages and other features of the invention will be set forth in part in the description which follows and, in part, will become apparent to those having ordinary skill in the art upon examination of the following, or may be learned from the practice of the invention. The advantages and features of the invention may be realized and obtained as particularly pointed out in the appended claims.

According to the present invention, the foregoing and other advantages are achieved in part by a method of forming a gate for a FinFET. The method includes forming a first layer of material over a fin and forming a second layer over the first layer, the second layer including at least one of Ti and TiN. The method further includes forming a third layer over the second layer, the third layer comprising an anti-reflective coating and etching the first, second and third layers to form the gate for the FinFET.

According to another aspect of the invention, a method of forming a gate electrode for a FinFET is provided. The method includes forming a first layer over a fin and forming an etch stop layer over the first layer. The method further includes applying an anti-reflective coating to the etch stop layer and forming a photo-resist layer in a gate pattern over the anti-relective coating. The method also includes etching the anti-reflective coating and etching the etch stop layer and the first layer to form the gate electrode in the first layer in a shape corresponding to the gate pattern.

According to a further aspect of the invention, a structure for forming a FinFET is provided. The structure includes a fin formed on a substrate and a first layer formed over the fin. The structure further includes a second layer formed over the first layer, the second layer including at least on of Ti and TiN. The structure also includes a third layer formed over the second layer, the third layer including an anti-reflective coating, and wherein the first, second and third layers are etched to form a gate for the FinFET in the first layer.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims.

Consistent with the present invention, an etch stop layer may be formed between an ARC and a polysilicon layer used to form a FinFET gate. The etch stop layer may prevent over-etching of the ARC, that can occur due to the severe topography of the fin device, from attacking the source/drain regions or gate material of the FinFET. The etch stop layer may include Ti or TiN that has a very low etch rate in a fluorine etching process, such as, for example, a $CF_4$/Ar etching process.

Figure 1B:
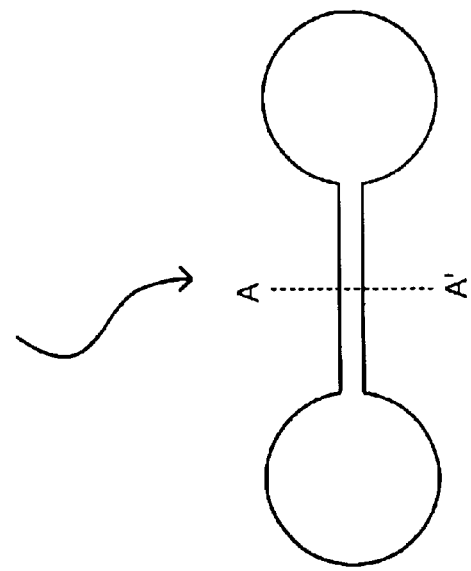
FIGS. 1A and 1B illustrate an exemplary FinFET fin channel and source/drain formed on a substrate consistent with the present invention.
Figure 1A:
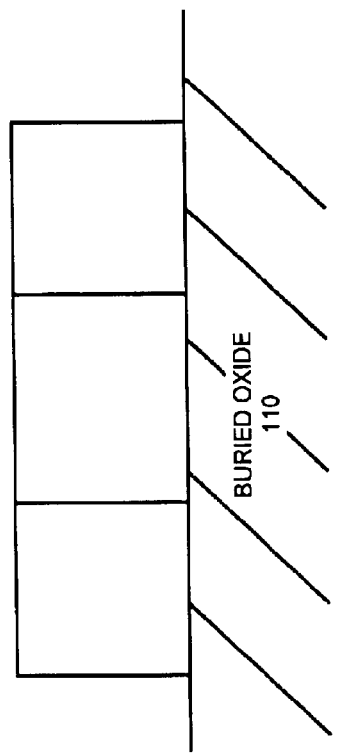

FIGS. 1A and 1B illustrate a FinFET fin channel and source/drain (S/D) 105 formed on a buried oxide layer 110 in accordance with an exemplary embodiment of the present invention. Fin channel and S/D 105 may be formed on buried oxide layer 10 using any conventional technique. Fin channel and S/D 105 may include, for example, silicon (Si). Other materials, such as Germanium (Ge), may alternatively be used.

Figure 2B:
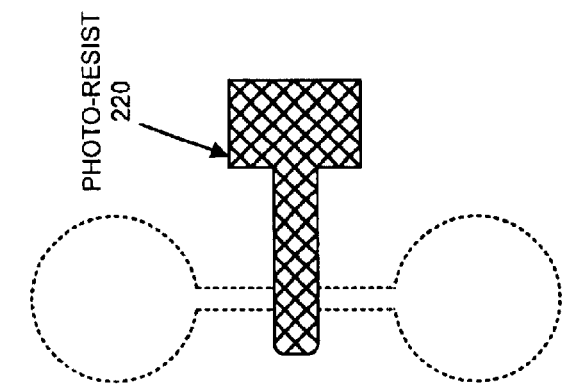
FIGS. 2A and 2B illustrate an polysilicon layer, etch stop layer, anti-reflective coating, and photoresist layer formed on the fin channel and source/drain of FIGS. 1A and 1B consistent with the invention.
Figure 2A:
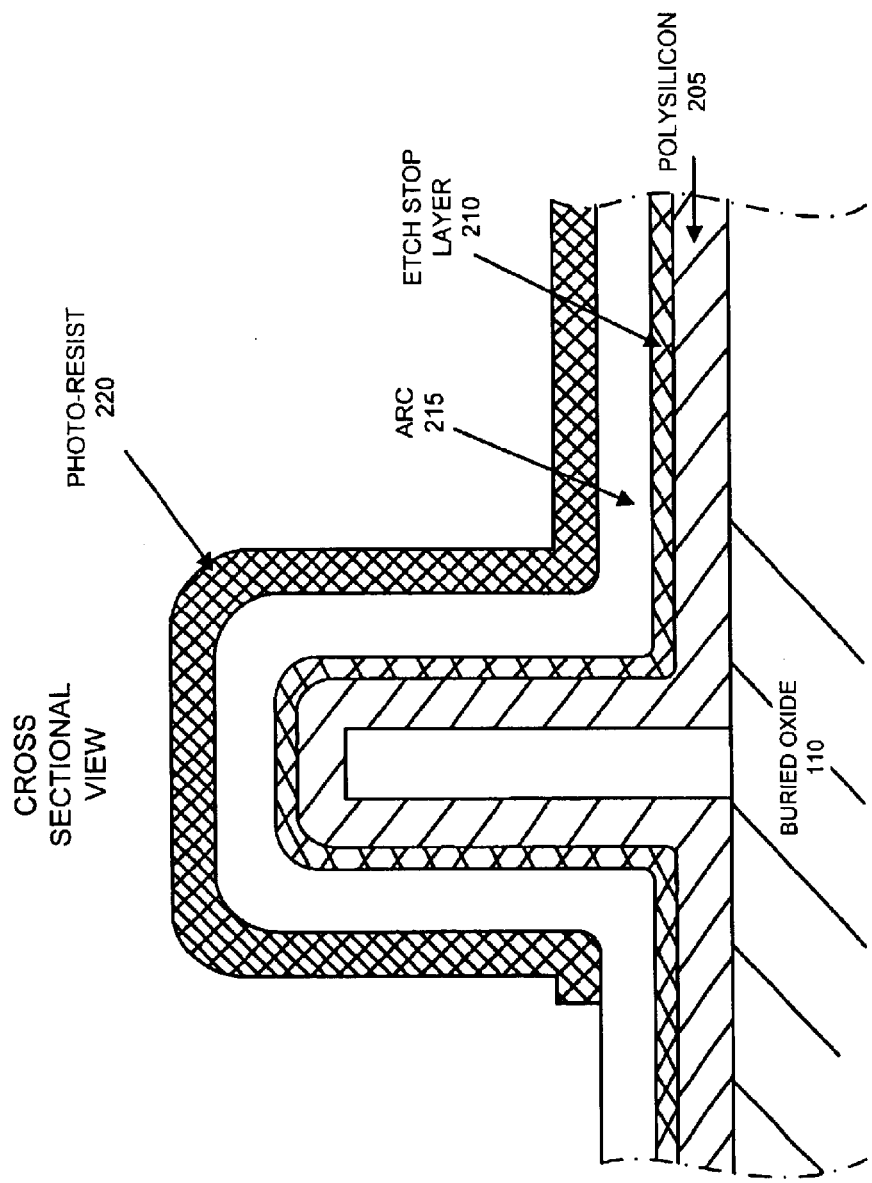

As shown in FIG. 2A, a layer 205 of polysilicon, for example, may be formed over fin channel and S/D 105. FIG. 2A is a cross-sectional view taken along the line A–A' in FIG. 1B. Polysilicon layer 205 may be formed, for example, using conventional deposition processes. The thickness of polysilicon layer 205 may range, for example, from about 500 Å to about 2000 Å. After forming polysilicon layer 205, an etch stop layer 210 may be formed on polysilicon layer 205. Etch stop layer 210 may include, for example, Ti or TiN. The thickness of layer 210 may range, for example, from about 50 Å to about 150 Å. An anti-reflective coating (ARC) 215 may then be applied to etch stop layer 210. ARC 215 may be applied, for example, using existing spin-on or chemical vapor deposition (CVD) techniques. ARC 215 may include, for example, SiN ARC. As shown in FIGS. 2A and 2B, a photo-resist layer 220, patterned in the shape of a desired FinFET gate, may be formed on ARC 215. Photo-resist layer 220 may include any type of existing photo-resist material employed in conventional photolithography.

Figure 3:
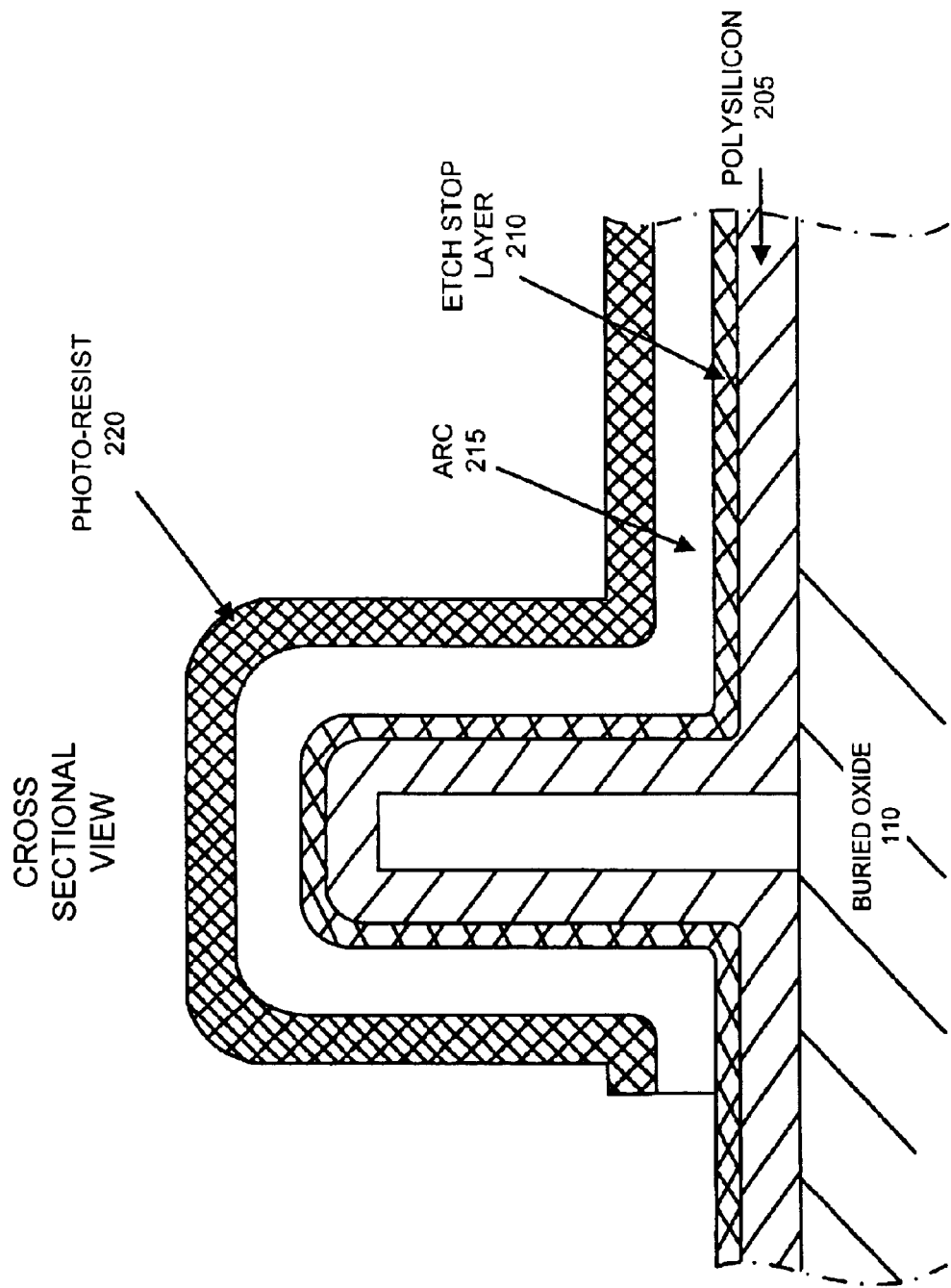
FIG. 3 illustrates a cross-sectional view of etching of the anti-reflective coating of FIG. 2A consistent with the invention.
Figure 4:
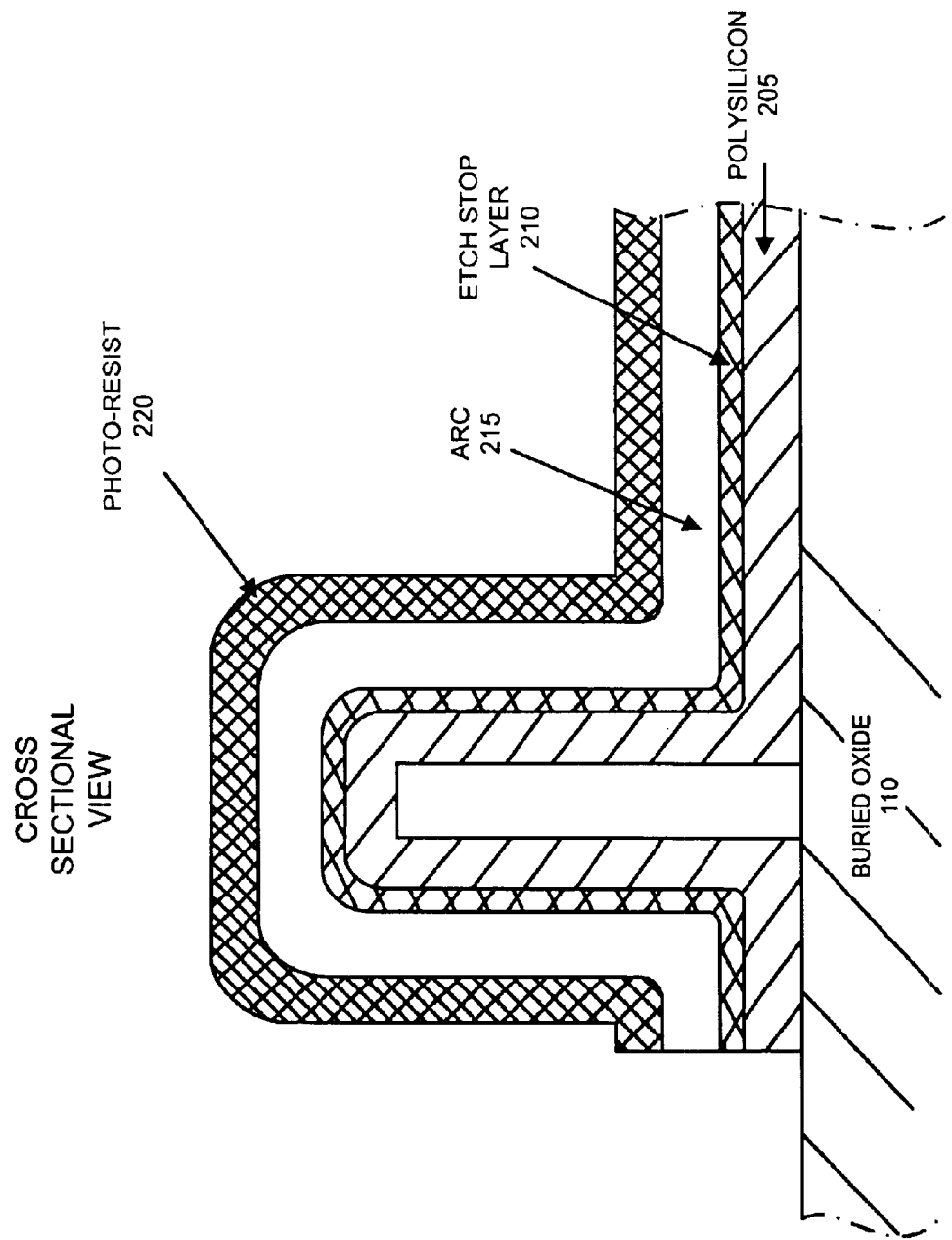
FIG. 4 illustrates a cross-sectional view of etching of the etch stop layer and polysilicon layer of FIG. 3 consistent with the invention.
Figure 5B:
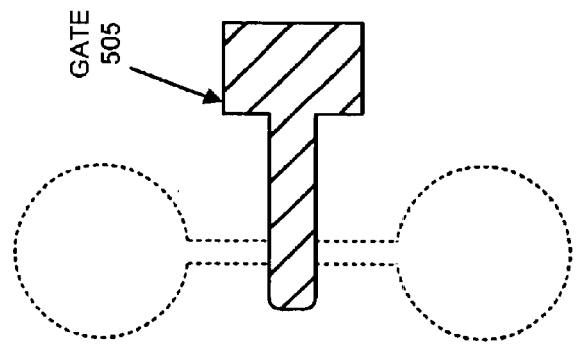
FIGS. 5A and 5B illustrate a gate formed upon the fin channel and source/drain of FIG. 1A consistent with the invention.
Figure 5A:
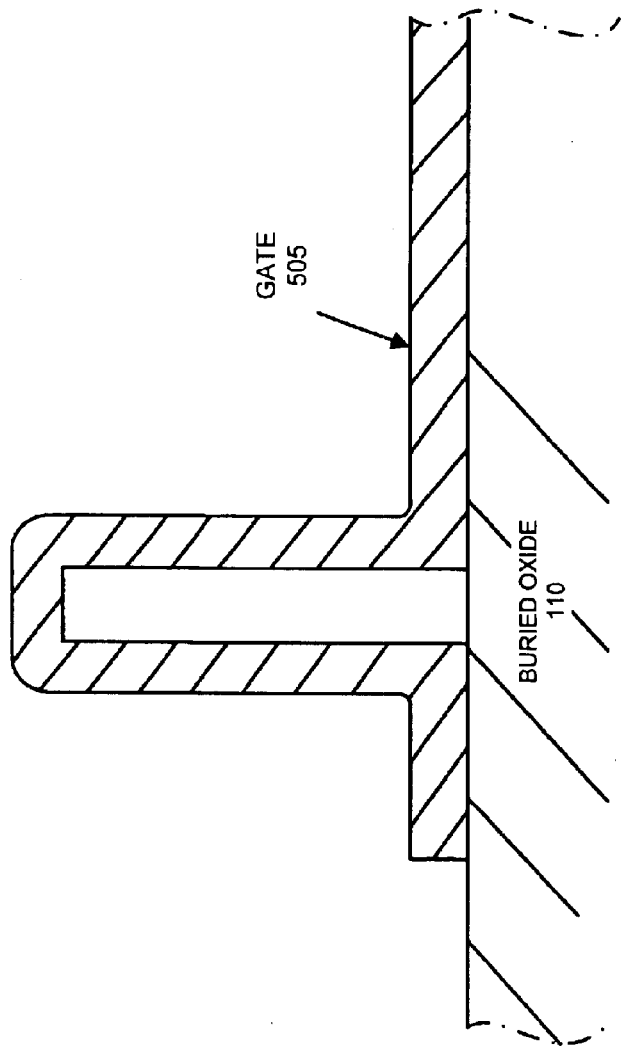

After formation of polysilicon layer 205, etch stop layer 210, ARC 215, and photo-resist layer 220, ARC layer 215 may be etched away, as shown in FIG. 3, using, for example, a $CF_4$/Ar etching process. Since the Ti or TiN of etch stop layer 210 has a very low etch rate in F-based chemistries, owing to the low vapor pressure of $TiF_4$ type product species at typical polysilicon gate plasma etch temperatures of 50–70 degrees C., a large over etch of ARC 215 can occur without effecting polysilicon layer 205. As shown in FIG. 4, etch stop layer 210 and polysilicon layer 205 may then be etched using, for example, a $Cl_2$/HBr or $Cl_2/N_2/O_2$ etching process. After etching, any remaining portions of etch stop layer 210, ARC 215 and photo-resist layer 220 may be removed to leave polysilicon layer 205 formed in the shape of gate 505, as shown in FIGS. 5A and 5B.

EXEMPLARY SPACER FOR GATE FORMATION

When using conventional processes, the severe topography of the FinFET device increases the chances of process errors when forming the FinFET gate. The topography can change the effective coated thickness of photo-resist on fin structures. Since the resist thickness affects the net reflectance and hence the retained dose, critical dimension of the gate features can vary over the wafer. This dimension needs good control to attain proper device performance. Hence, any technique to reduce the steep topography on the fin features would be helpful to the overall fabrication. Consistent with another exemplary embodiment of the invention, a spacer may be formed on a layer of material, from which the gate is to be formed, to create a less severe topography that improves the gate formation process.

Figure 6:
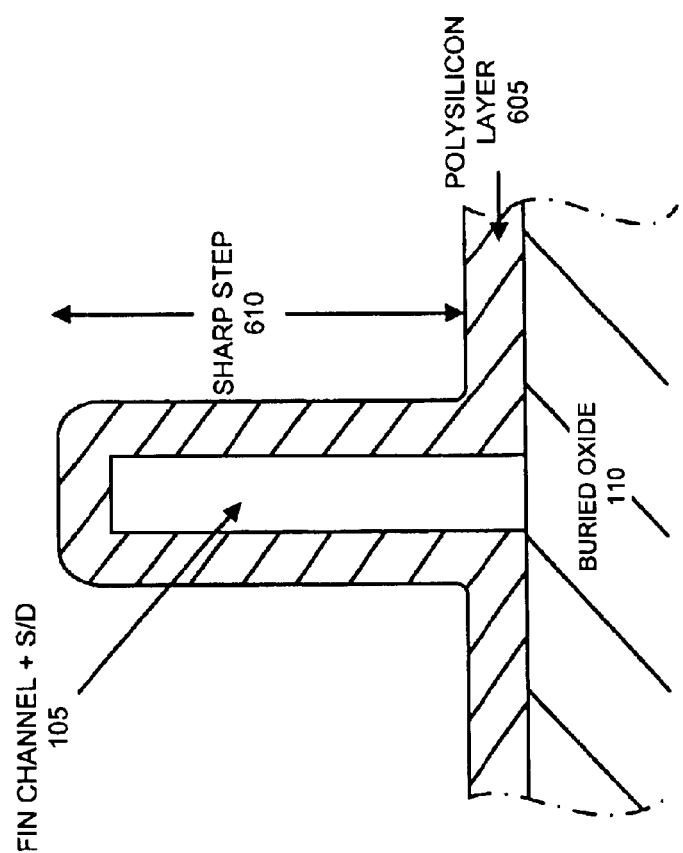
FIG. 6 illustrates a cross-sectional view of an exemplary polysilicon layer formed on the fin channel and source/drain of FIG. 1A consistent with another embodiment of the invention.

As shown in FIG. 6, a layer 605 of polysilicon, for example, may be formed over a fin channel and source/drain, such as fin channel and S/D 105 shown in FIGS. 1A and 1B. Polysilicon layer 605 may be formed, for example, using conventional deposition processes. The thickness of polysilicon layer 605 may range, for example, from about 500 Å to about 2000 Å.

Figure 7:
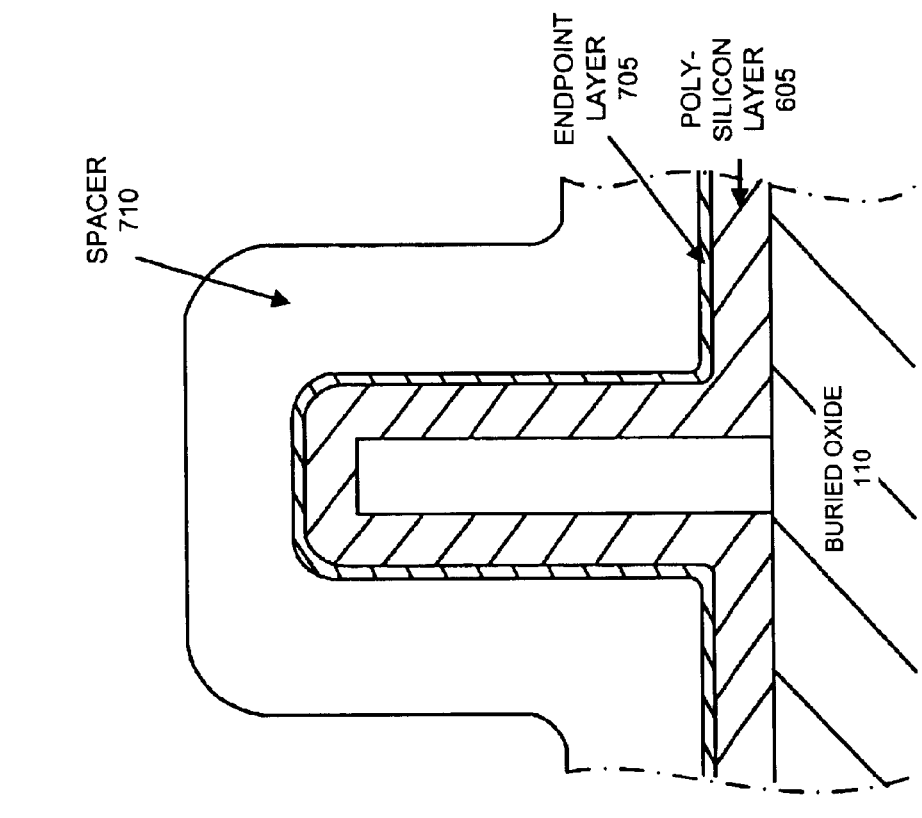
FIG. 7 illustrates a cross-sectional view of an exemplary endpoint layer and spacer formed on the polysilicon layer of FIG. 6 consistent with the invention.

As shown in FIG. 7, an endpoint layer 705 may then be formed on polysilicon layer 605. Endpoint layer 705 may include, for example, a layer of Ti or SiGe in a thickness ranging, for example, from about 50 Å to about 100 Å. Endpoint layer 705 may be formed, for example, using conventional deposition processes. A spacer 710 may be formed on endpoint layer 705. Spacer 710 may include, for example, polysilicon. If polysilicon is used, the etch steps used for the standard poly gate structure can continue to be used since all the layers (including endpoint indicator) will etch in poly etch chemistry. If alternate materials such as oxide or nitride are used for the spacer, the poly etch process will have to be modified to clear out this spacer first using processes selective to Si such as $C_4F_8$/CO/Ar or $CHF_3$/Ar. The thickness of spacer 710 may range, for example, from about 500 Å to about 1500 Å.

Figure 8:
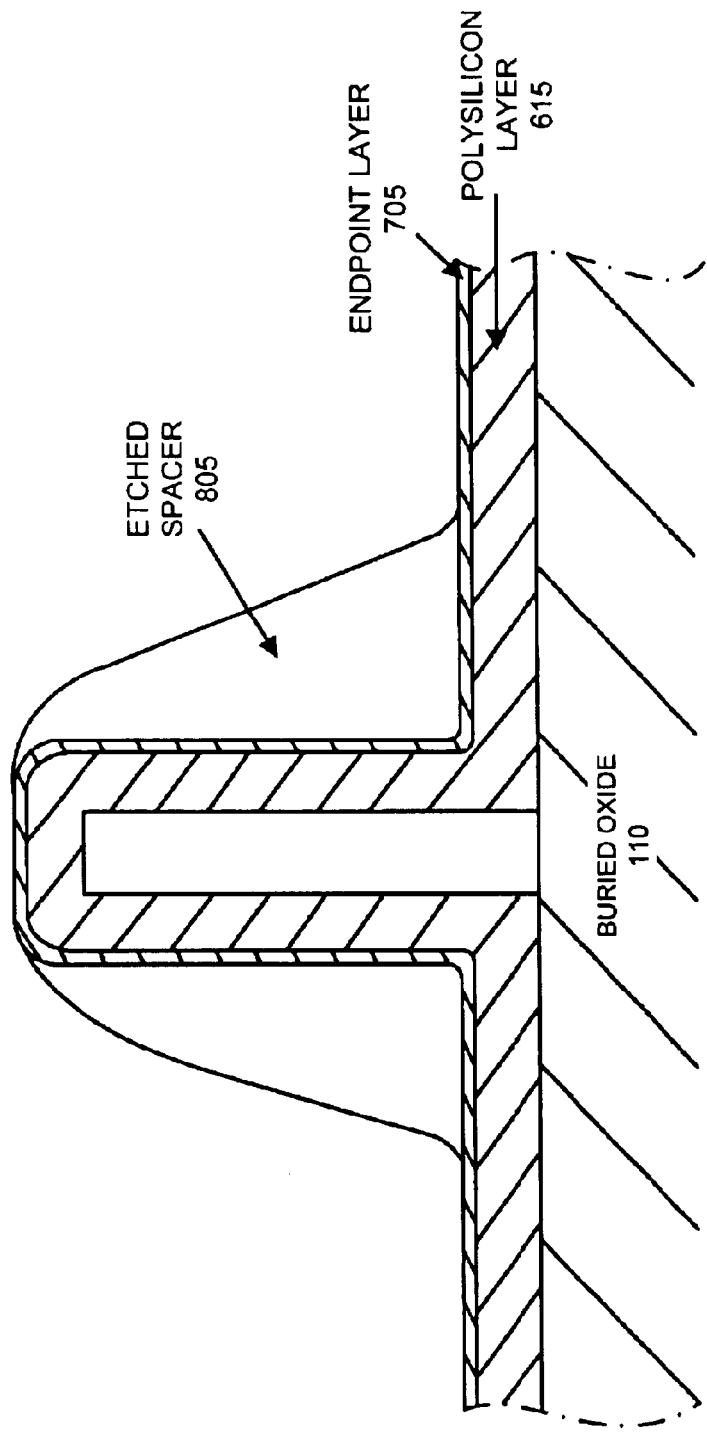
FIG. 8 illustrates etching of the spacer of FIG. 7 consistent with the invention.

As shown in FIG. 8, spacer 710 may then be etched, using an existing etching process, to create an etched spacer 805 that has a more gentle topography. Photo-resist may then be applied more uniformly to the gentle topography than would be the case with the sharp step 610 shown in FIG. 6. This applied photo-resist may then be used to etch polysilicon layer 615 into a desired gate shape (not shown).

EXEMPLARY BARC FOR FORMING FINFET GATE

In some conventional FinFET gate formation processes, a layer of polysilicon (e.g., 200–1500 Å thickness) is deposited over the FinFET fin, followed by a SiRN BARC (e.g., approximately 200 Å thickness). During subsequent etching of the BARC and polysilicon to form the gate, using, for example, fluorine materials, SiRN "stringers" or extra pattern defects may be formed at the corners of the topography due to over etching. Additionally, in instances of extreme over etching of the BARC and polysilicon, the source and drain regions of the fin may be attacked, or the protective oxide or gate dielectric formed on surfaces of the fin may be damaged or removed.

In yet another exemplary embodiment of the invention, a process for forming a FinFET gate is provided that enables very small gate electrode patterning (e.g., 10–40 nm) without causing the formation of stringers, or source/drain damage to the FinFET device. In this exemplary embodiment of the invention, organic BARC may be formed over the gate polysilicon and etched with HBr/02 chemistry or He/N$_2$/O$_2$ chemistry. Etching of the organic BARC, thus, does not require harsh fluorine containing materials, thereby, reducing damage to the FinFET fin.

Figure 9B:
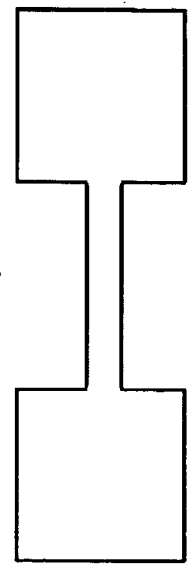
FIGS. 9A and 9B illustrate an exemplary FinFET fin channel and source/drain formed on a substrate consistent with yet another embodiment of the invention.
Figure 9A:
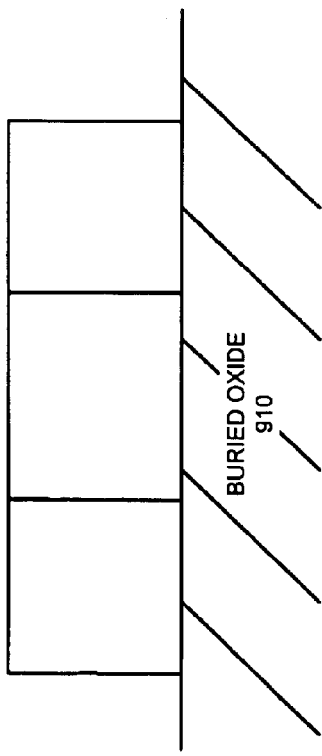

FIGS. 9A and 9B illustrate a FinFET fin channel and source/drain (S/D) 905 formed on a buried oxide layer 910 in accordance with this exemplary embodiment of the invention. Fin channel and S/D 905 may be formed on buried oxide layer 910 using any conventional technique. Fin channel and S/D 905 may include, for example, silicon (Si). Other materials, such as Germanium (Ge), may alternatively be used.

Figure 10:
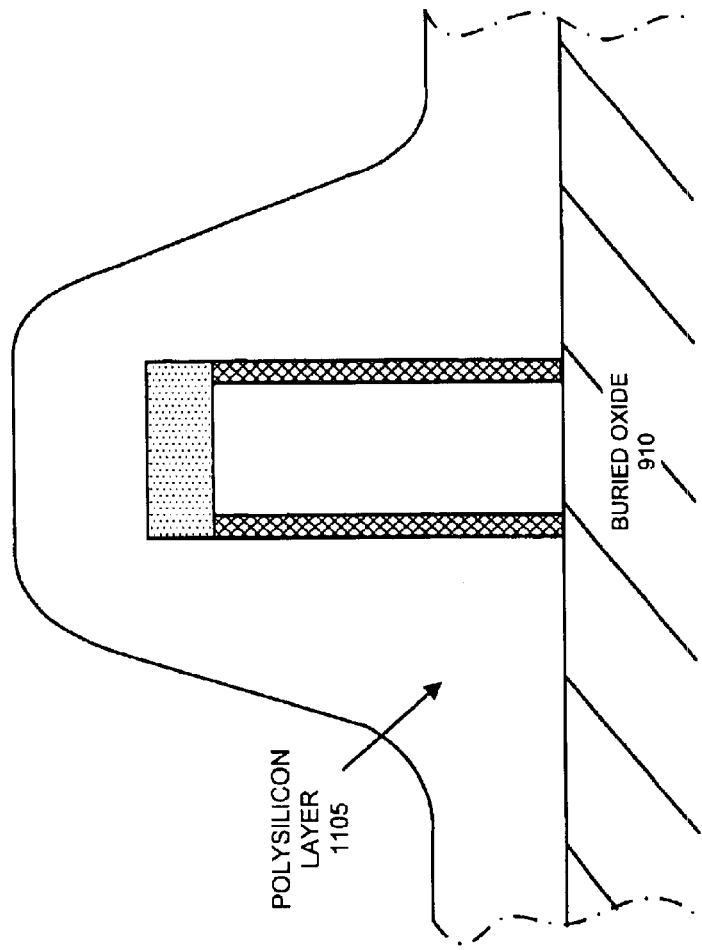
FIG. 10 illustrates a cross-sectional view of an exemplary dielectric and protective layer formed on the fin channel of FIG. 9A consistent with the invention.
Figure 11:
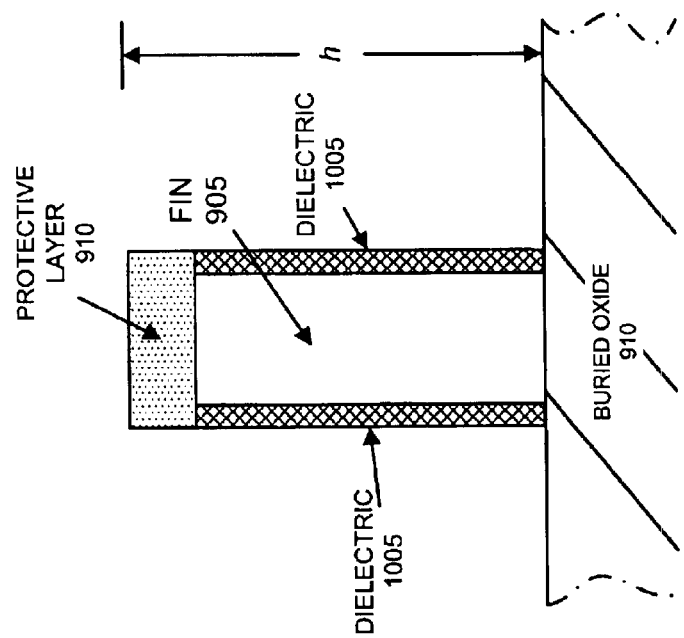
FIG. 11 illustrates a cross-sectional view of an exemplary polysilicon layer formed on the fin channel and source drain of FIGS. 9A and 9B consistent with the invention.

As shown in FIG. 10, subsequent to formation of fin channel and S/D 905, a dielectric 1005 including, for example, an oxide material, may then be formed on the sidewalls of fin channel 905. Dielectric 1005 may be formed on the sidewalls of fin channel 905 using existing growth or deposition processes. The thickness of dielectric 1005 may range, for example, from about 10 Å to about 50 Å. A protective layer 910 may be formed on an upper surface of fin channel 905 using, for example, conventional growth or deposition processes. Protective layer 910 may include, for example, SiO$_2$. The height h of fin 905 and protective layer 910 may range, for example, from about 100 Å to about 1500 Å. A layer of polysilicon 1105 may then be formed on fin 905, as shown in FIG. 11. Polysilicon layer 1105 may be formed using, for example, conventional deposition processes. The thickness of polysilicon layer 1105 may range, for example, from about 500 Å to about 2000 Å.

Figure 12:
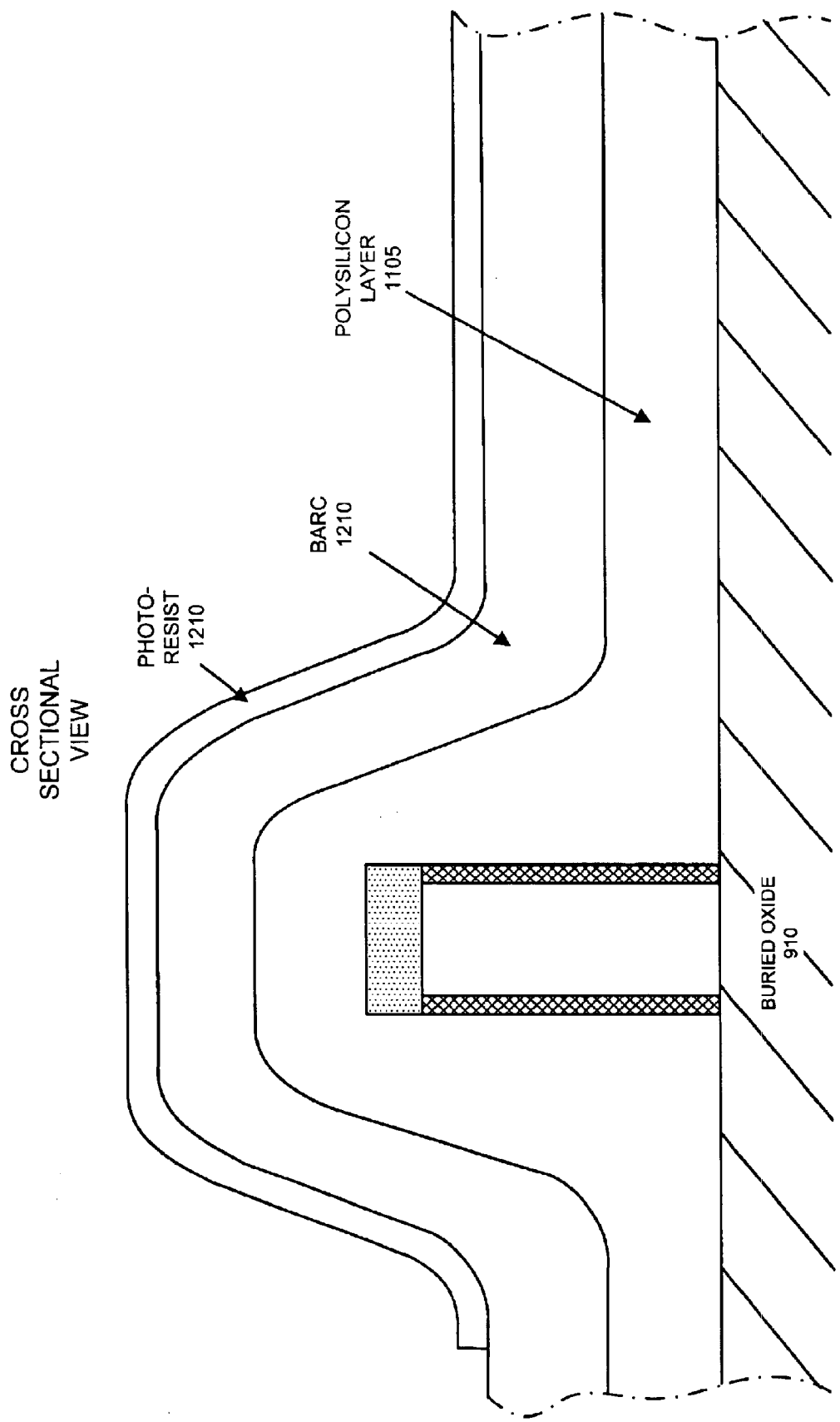
FIG. 12 illustrates a cross-sectional view of an exemplary bottom anti-reflective coating and photo-resist layer formed on the polysilicon layer of FIG. 11 consistent with the invention.
Figure 13:
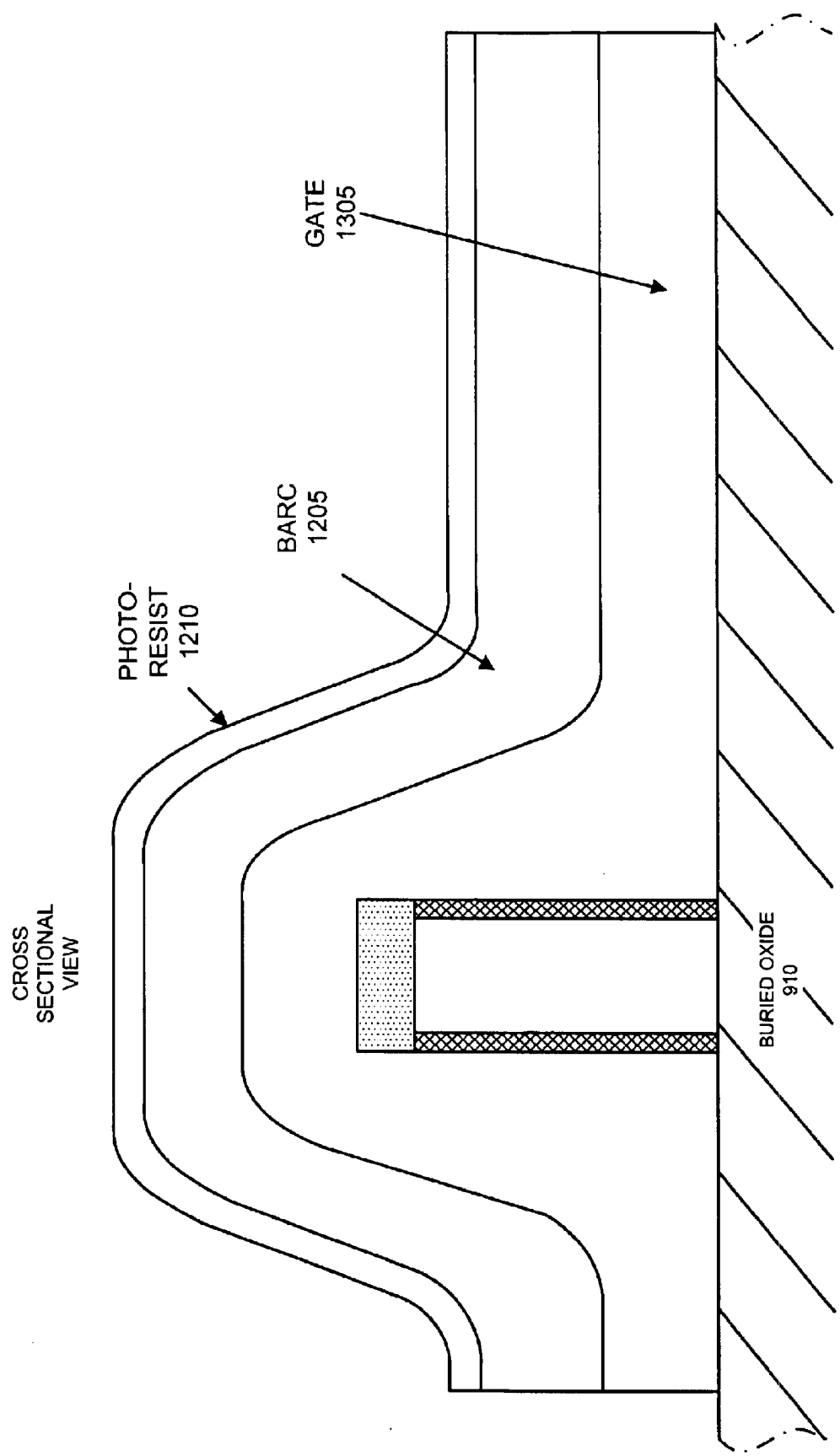
FIG. 13 illustrates a cross-sectional view of an exemplary gate formed by etching the bottom anti-reflective coating and polysilicon layer of FIG. 12 consistent with the invention.
Figure 14A:
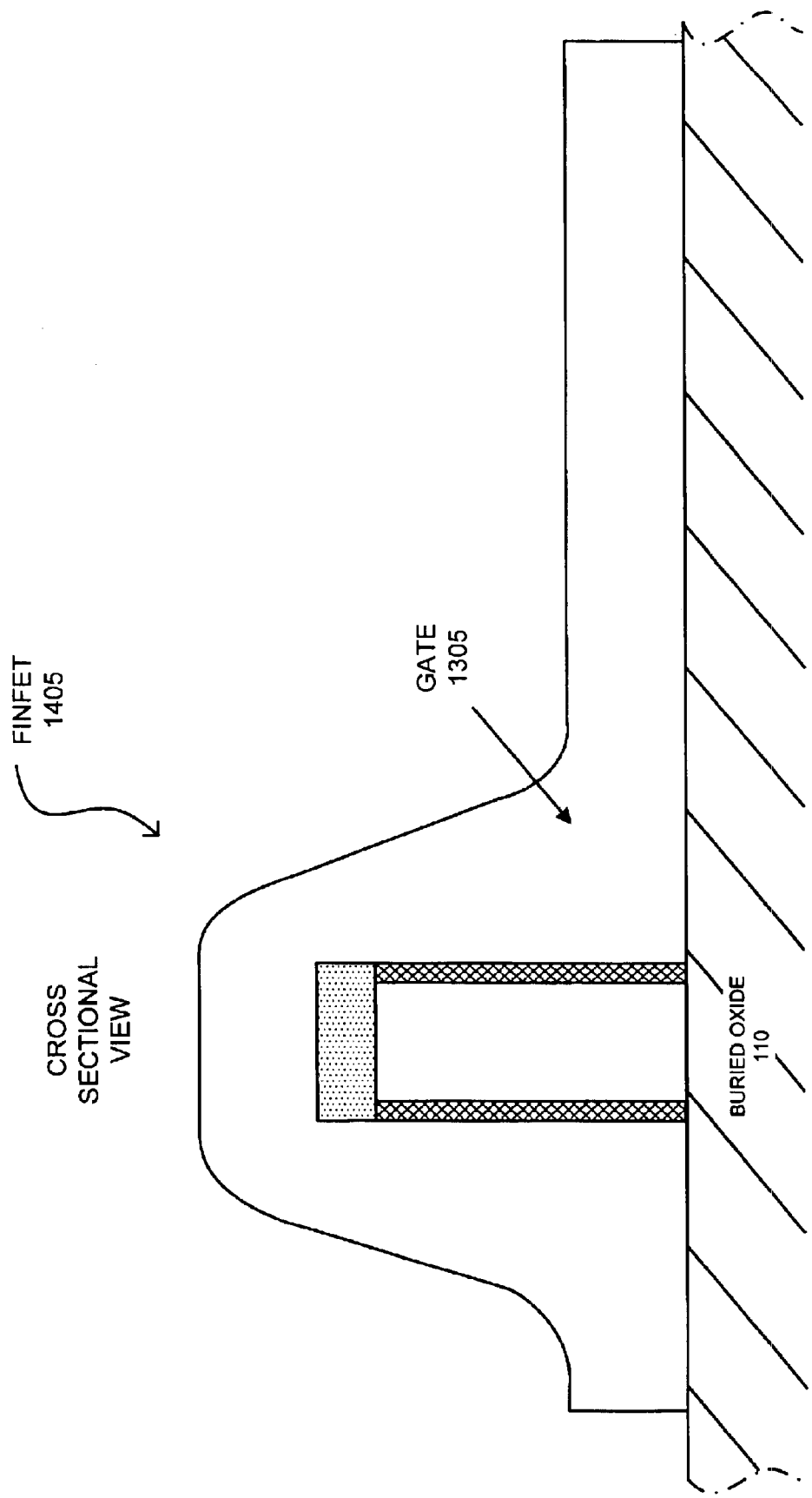
FIGS. 14A and 14B illustrate removal of bottom anti-reflective coating and photo-resist from the exemplary gate of FIG. 13 consistent with the invention.
Figure 14B:
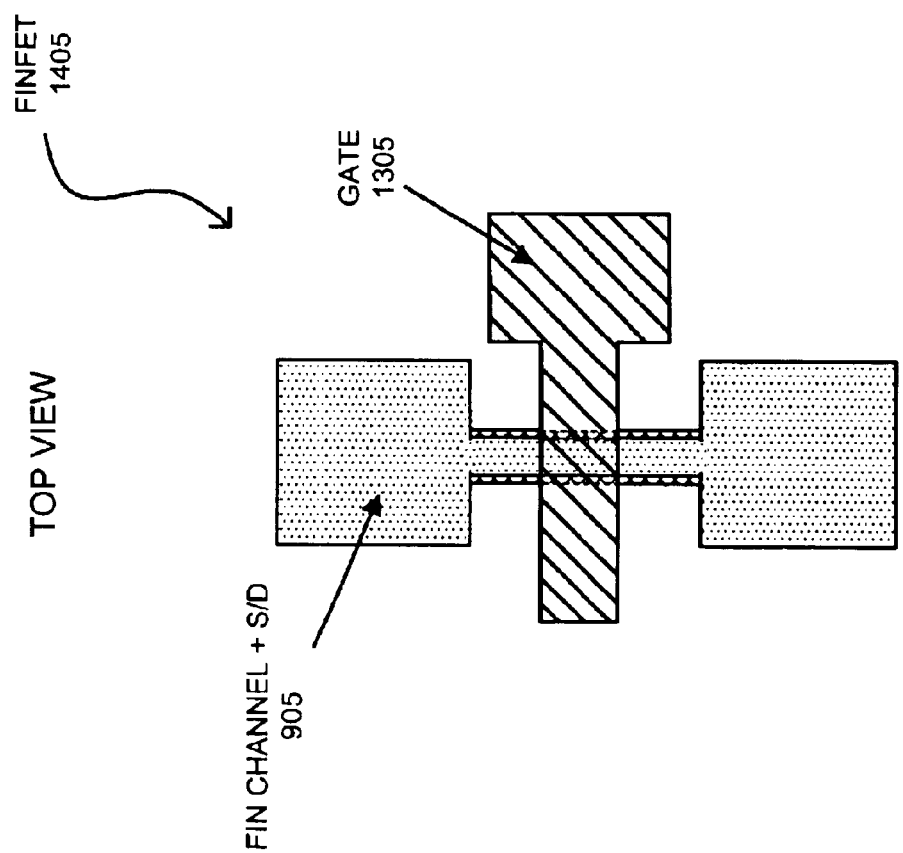

As shown in FIG. 12, a bottom anti-reflective coating (BARC) 1210 may be formed on polysilicon layer 1105. BARC 1210 may be formed using, for example, a conventional spin-on process. These BARCs are typically made of organic materials—standard BARCs of such type used in the industry are AR19, AR40, 1C1B etc. The organic nature of the material (similar to photoresist) enables etching the BARC in chemistries, such as N$_2$/O$_2$/He or HBr/O$_2$/Ar, that attack the polysilicon to a negligible extent, thus allowing significant BARC overetch over the steep fin topography. A layer of photo-resist, patterned in a shape of a desired gate, may then be formed on BARC 1210 using conventional techniques. BARC 1210 and polysilicon layer 1105 may then be etched to form polysilicon layer 1105 as a gate 1305 in the shape of photo-resist 1210, as shown in FIG. 13. BARC 1210 may be etched using, for example, conventional HBr/O$_2$ or He/N$_2$/O$_2$ etching processes. Polysilicon layer 1105 may be etched, for example, using a conventional Cl$_2$/HBr etching process. As shown in FIGS. 14A and 14B, BARC 1205 and photo-resist 1210 may then be removed to form a FinFET 1405.

In the previous descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention. In practicing the present invention, conventional photolithographic and etching techniques may be employed, and hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A method of forming a gate electrode for a Fin Field Effect Transistor (FinFET), comprising:

forming a first layer over a fin;

forming an etch stop layer over the first layer;

applying an anti-reflective coating to the etch stop layer;

forming a photo-resist layer in a gate pattern over the anti-relective coating;

etching the anti-reflective coating; and etching the etch stop layer and the first layer to form the gate electrode in the first layer in a shape corresponding to the gate pattern.

2. The method of claim 1, further comprising:

removing the photo-resist layer subsequent to etching the etch stop layer and the first layer.

3. The method of claim 1, wherein the first layer comprises polysilicon.

4. The method of claim 1, wherein the etch stop layer comprises Ti.

5. The method of claim 1, wherein the etch stop layer comprises TiN.

6. The method of claim 1, wherein the anti-reflective coating comprises SiN.

7. The method of claim 1, wherein etching the anti-reflective coating comprises:

etching the anti-reflective coating using CF$_4$/Ar.

8. The method of claim 1, wherein etching the etch stop layer and the first layer comprises:

etching the etch stop layer and the first layer using Cl$_2$/HBr.

9. A method of forming a gate for a Fin Field Effect Transistor (FinFET), comprising:

forming a first layer of material over a fin;

forming a second layer over the first layer, the second layer comprising at least one of Ti and TiN;

forming a third layer over the second layer, the third layer comprising an anti-reflective coating; and etching the first, second and third layers to form the gate for the FinFET.

10. The method of claim 9, wherein the first layer of material comprises polysilicon.

11. The method of claim 9, wherein the anti-reflective coating comprises SiN.

12. The method of claim 9, wherein etching the third layer comprises:

etching the third layer with a CF$_4$/Ar etching process.

13. The method of claim 9, wherein etching the first and second layers comprises:

etching the first and second layers with a Cl$_2$/HBr etching process.

14. The method of claim 9, further comprising:

applying a photo-resist layer in a pattern corresponding to the gate to the third layer prior to etching the anti-reflective coating.

15. A structure for forming a Fin Field Effect Transistor (FinFET), comprising:

a fin formed on a substrate;
a first layer formed over the fin;
a second layer formed over the first layer, the second layer comprising at least one of Ti and TiN;
a third layer formed over the second layer, the third layer comprising an anti-reflective coating,
wherein the first, second and third layers are etched to form a gate for the FinFET in the first layer.

16. The structure of claim 15, wherein the first layer comprises polysilicon.

17. The structure of claim 15, wherein the third layer comprises SiN.

18. The structure of claim 15, further comprising:
a photo-resist layer formed over the third layer.

19. The structure of claim 15, wherein the third layer is etched with $CF_4/Ar$.

20. The structure of claim 15, wherein the first and second layers are etched with $Cl_2/HBr$.

* * * * *